(12) United States Patent
Hellberg et al.

(10) Patent No.: US 6,473,012 B2
(45) Date of Patent: Oct. 29, 2002

(54) A/D CONVERTER BACKGROUND CALIBRATION

(75) Inventors: Richard Hellberg, Huddinge (SE); Bengt Erik Jonsson, Spånga (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/808,256

(22) Filed: Mar. 14, 2001

(65) Prior Publication Data

US 2001/0026233 A1 Oct. 4, 2001

(30) Foreign Application Priority Data

Mar. 14, 2000 (SE) .............................................. 0000843
Aug. 29, 2000 (SE) .............................................. 0003043

(51) Int. Cl.[7] .............................................. H03M 1/10
(52) U.S. Cl. .......................... 341/120; 341/118; 341/155
(58) Field of Search .............................. 341/120, 131, 341/118, 111, 155, 156, 122, 123

(56) References Cited

U.S. PATENT DOCUMENTS

| | | | | |
|---|---|---|---|---|
| 4,903,021 A | * | 2/1990 | Leibholz | 341/110 |
| 5,305,004 A | * | 4/1994 | Fattaruso | 341/120 |
| 5,315,627 A | * | 5/1994 | Draving | 377/20 |
| 5,499,027 A | | 3/1996 | Karanicolas et al. | |
| 5,606,584 A | | 2/1997 | Beat | |
| 5,786,951 A | | 7/1998 | Welland et al. | |
| 5,793,318 A | | 8/1998 | Jewett | |
| 5,818,372 A | | 10/1998 | Noro | |
| 5,926,123 A | * | 7/1999 | Ostrom et al. | 341/120 |
| 6,255,971 B1 | * | 7/2001 | Van de Plassche et al. | 341/120 |

FOREIGN PATENT DOCUMENTS

EP    0 430 599    6/1991

OTHER PUBLICATIONS

U.K. Moon & B.S. Song "Background Digital Calibration Techniques for Pipelined ADC"s", IEEE Trans. Circ. Syst. II, pp. 102–109, vol. 44, No. 2, Feb. 1997.
S.U. Kwak, B.S. Song, and K. Bacrania, "A 15–b, 5–Msample/s Low–Spurious CMOS ADC", IEEE J. Solid–State Circ. pp. 1866–1875, vol. 32, No. 12, Dec. 1997.
O.E. Erdogan, P.J. Hurst, & S.H. Lewis, "A 12b Digital–Background–Calibrated Algorithmic ADC with –90dB THD", 1999 Intl. Solid State Circ Conf., pp. 316–317, Feb. 1999.
T. Ritter, "The Efficient Generation of Cryptographic Confusion Sequences", Cryptologia, pp. 81–139, vol. 15, No. 2, Apr. 1991.
D.W. Clark & L.J. Weng, "Maximal and Near–Maximal Shift Register Sequences: Efficient Event Counters and Easy Discrete Logarithms", IEEE Trans. Computers, pp. 560–568, vol. 43, No. 5, May 1994.

* cited by examiner

Primary Examiner—Michael Tokar
Assistant Examiner—John Nguyen
(74) Attorney, Agent, or Firm—Burns, Doane, Swecker & Mathis, L.L.P.

(57) ABSTRACT

A background calibrated A/D converter includes a random time interval generator that initiates background calibration at randomly selected time instants to increase the spurious-free dynamic range of the A/D converter.

13 Claims, 9 Drawing Sheets

A/D CONVERTER BACKGROUND CALIBRATION

This application claims priority under 35 U.S.C. §§ 119 and/or 365 to 0000843-3 and 0003043 filed in Sweden on Mar. 14, 2000 and Aug. 29, 2000 respectively; the entire content of which is hereby incorporated by reference.

BACKGROUND

The present invention relates to a background calibrated analog-to-digital (A/D) converter and an A/D converter background calibration method.

This invention relates to A/D converters, and in particular how to reduce the distortion caused by background calibration of such converters. The maximum achievable accuracy-speed performance of any A/D-converter is limited by non-ideal effects associated with its building blocks. Typically, the performance is limited by settling time, finite amplifier gain and/or analog component mismatch. When designing high-speed, high-accuracy A/D converters, these limitations impose very stringent demands on the building blocks, leading to prolonged design time. It also requires the use of manufacturing processes that are optimized for component matching and performance, thus increasing the manufacturing cost. Many non-ideal effects can however be compensated for by calibration. See for example, U.S. Pat. No. 5,499,027, "Digitally self-calibrating pipeline analog-to-digital converter". The problem is that the efficiency of the calibration may be degraded by drift and aging. Therefore, it is desirable to be able to continuously calibrate the A/D converter during normal operation. Many calibration schemes rely on some form of skip-and-fill method. See "Background Digital Calibration Techniques for Pipelined ADC's", U.-K. Moon, and B.-S. Song, IEEE Trans. Circ. Syst.- II, pp. 102–109, Vol. 44, No. 2, February 1997, IEEE, and "A 15-b, 5-Msample/s Low-Spurious CMOS ADC", S.-U. Kwak, B.-S. Song, and K. Bacrania, IEEE J. Solid-State Circ., pp. 1866–1875, Vol. 32, No. 12, December 1997, IEEE. In such methods, widely separated samples are skipped in the conversion and replaced by a fill sample usually calculated from interpolation of neighboring samples. At each skip, a calibration operation is performed. The error of the fill sample is seen as an increase in noise and/or spurious tones or frequency components in the output frequency spectrum. When the skip-rate is high, the fill-sample error is mainly represented by spurious tones, which is highly undesirable in, for example, telecommunications systems. Nevertheless it may sometimes be desirable to have a short re-calibration cycle (high skip-rate) in order to track more rapid changes in the operating conditions.

Another method for creating a calibration time-slot is found in "A 12b Digital-Background-Calibrated Algorithmic ADC with −90 dB THD", O. E. Erdogan, P. J. Hurst, and S. H. Lewis, 1999 Intl. Solid-State Circ. Conf., pp. 316–317, February 1999, IEEE., where an input sample queue is formed by a cascade of sample-and-hold circuits. By emptying the queue slightly faster than it is filled, a calibration time-slot is occasionally available. Thus, this "input-queue" method has the benefit of creating a time-slot for calibration without the need to discard any samples. The main drawback of this method is that each extra sample-and-hold stage adds distortion and noise. Therefore, this approach is not optimal for high-speed, high-resolution A/D converters.

Thus, the key idea in most prior-art solutions is to replace every $k^{th}$ sample with a fill sample of slightly less quality. This is not a problem in most cases, if k is a large number. However, sometimes a shorter re-calibration cycle is desirable, as noted above. A short re-calibration cycle (small k) will, however, reduce the spurious-free dynamic range (SFDR) of the A/D converter. In some applications, for example telecommunication applications, it is usually preferred that errors degrade the signal-to-noise ratio (SNR) rather than the spurious-free dynamic range. Thus, if there is a need for background calibration with a short re-calibration cycle, it is necessary to find a better solution than to skip and fill every $k^{th}$ sample.

SUMMARY

The present invention addresses these and other concerns. A method and system is provided which provides frequent background calibration of an A/D converter without significant degradation of the spurious-free dynamic range.

According to one aspect, a background calibrated A/D converter includes a background calibrated analog-to-digital converter, with a random time interval generator adapted to initiate background calibration at randomly selected time instants to increase the spurious-free dynamic range of the A/D converter.

According to another aspect, a method of calibrating an A/D converter includes an A/D converter background calibration method, including the step of increasing the spurious-free dynamic range of an A/D converter by initiating background calibration at randomly selected time instants.

These and other aspects of the present invention make it possible to have a high average skip-rate, while maintaining a large spurious free dynamic range.

BRIEF DESCRIPTION OF THE DRAWINGS

The invention, together with further objects and advantages thereof, may best be understood by making reference to the following description taken together with the accompanying drawings, in which.

DETAILED DESCRIPTION

Figure 1:
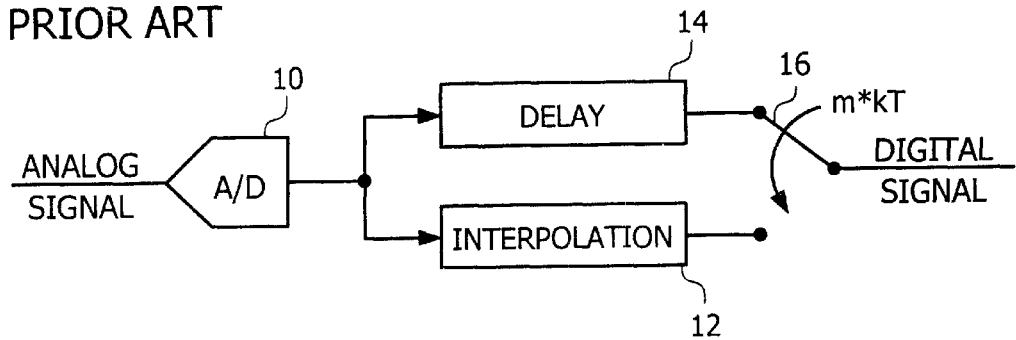
FIG. 1 is a block diagram of a conventional A/D converter with an interpolator.

In the following description the same reference designations will be used throughout the figures of the drawing for elements performing the same or similar functions.

Figure 2:
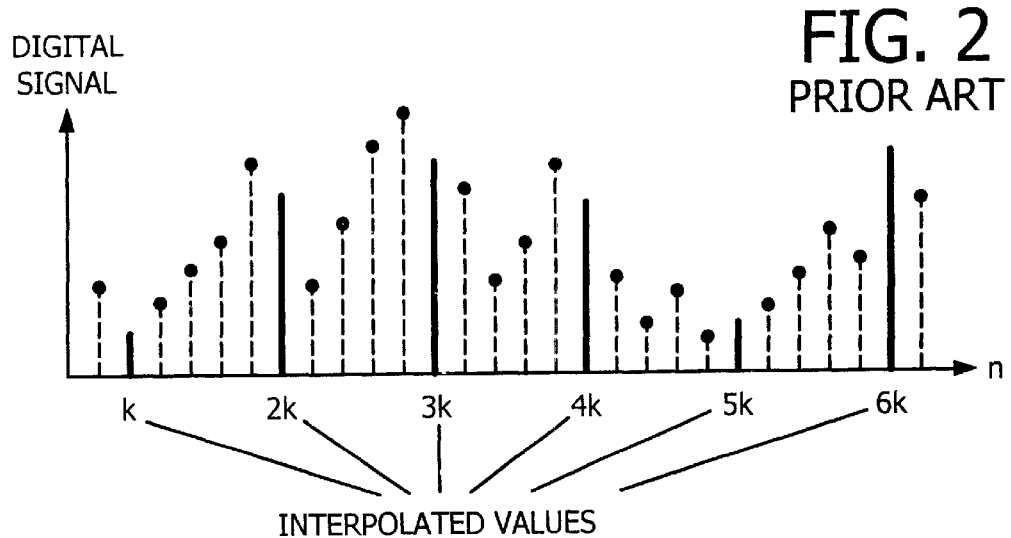
FIG. 2 is a timing diagram illustrating sampling with the A/D converter of FIG. 1.

One of the more popular approaches to background calibration is to use the "skip-and-fill" approach, as illustrated in FIG. 1. An analog signal is forwarded to an A/D converter 10. The digital samples are forwarded to an interpolator 12 and a delay element 14. A switch 16 is normally in the indicated upper position, in which the digital samples from delay element 14 are outputted at a sampling interval T. Every $k^{th}$ sample switch 16 is forced to its lower position, in which a sample is skipped and an interpolated digital sample from interpolator 12 is outputted instead. Thereafter switch 16 returns to its upper position. Calibration, or a part of a complete calibration of A/D converter 10 is performed during the interpolation. The A/D converter output signal is illustrated in FIG. 2, where the interpolated samples have been indicated by solid lines.

Figure 3:
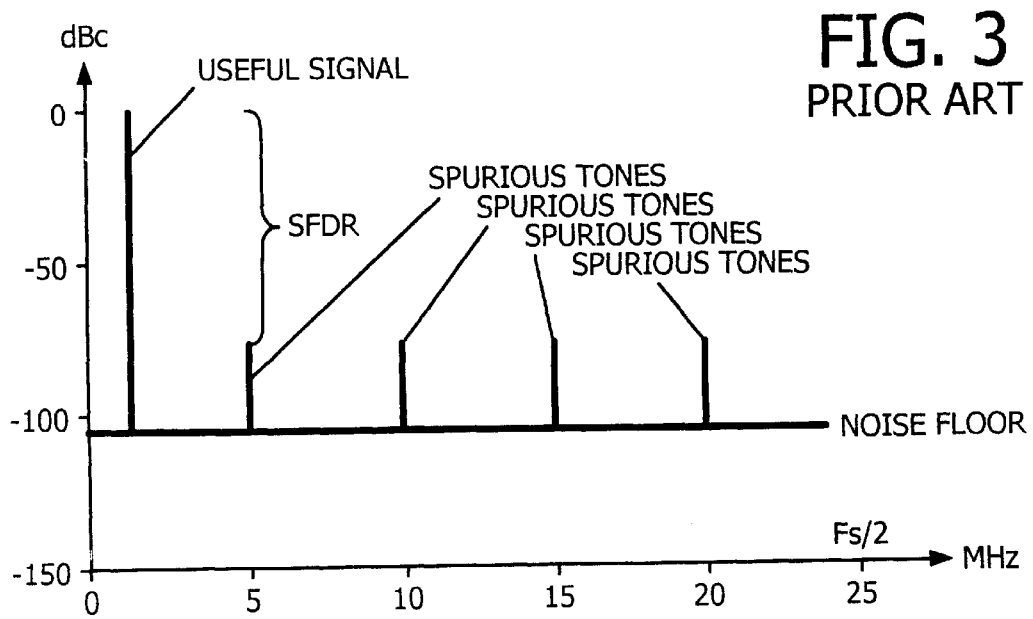
FIG. 3 is a simplified diagram illustrating the spectrum of a signal that has been digitized by the A/D converter in FIG. 1.

It can be shown that the fill error (due to the interpolation) appears at multiples of the frequency $f_s/k$, where $f_s$ is the sampling rate. When k is large, the error is spread out over a large number of frequencies. Therefore it appears more or less as noise. However, when k is small, e.g., k=10, the error is concentrated to a small number of frequency components. Consequently, each of these spurious frequency components becomes more dominant. The simulated output spectrum of an ideal 14-b ADC having every $10^{th}$ sample replaced by a fill sample with 10-b resolution is shown in FIG. 3. The spurious components or tones at $f_s/10$ are obvious ($f_s$=50 MHZ).

Figure 4:
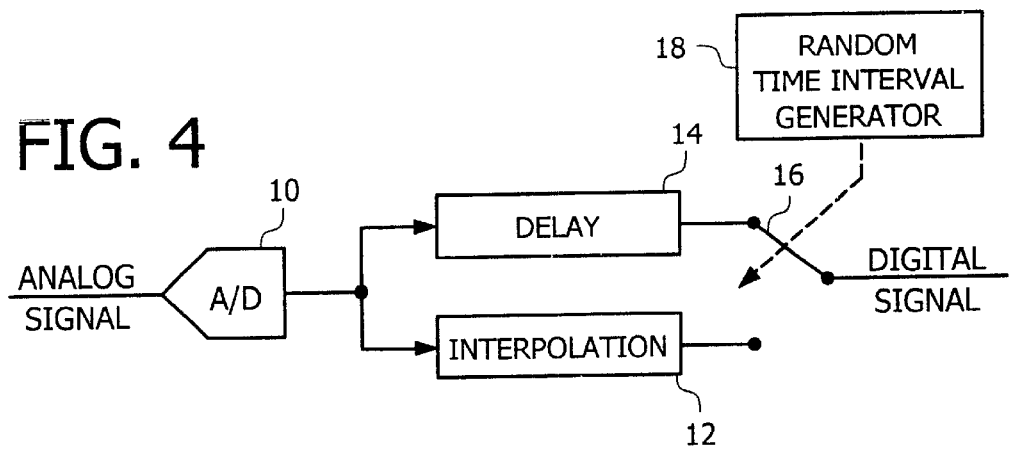
FIG. 4 is a block diagram of an A/D converter with an interpolator configured in accordance with the present invention.

FIG. 4 is a block diagram of an A/D converter with an interpolator configured in accordance with the present invention. In this case switch 16 is not actuated at regularly spaced time instants. Instead switch 16 is controlled by a random time interval generator 18, which actuates the switch at randomly selected time instants.

Figure 5:
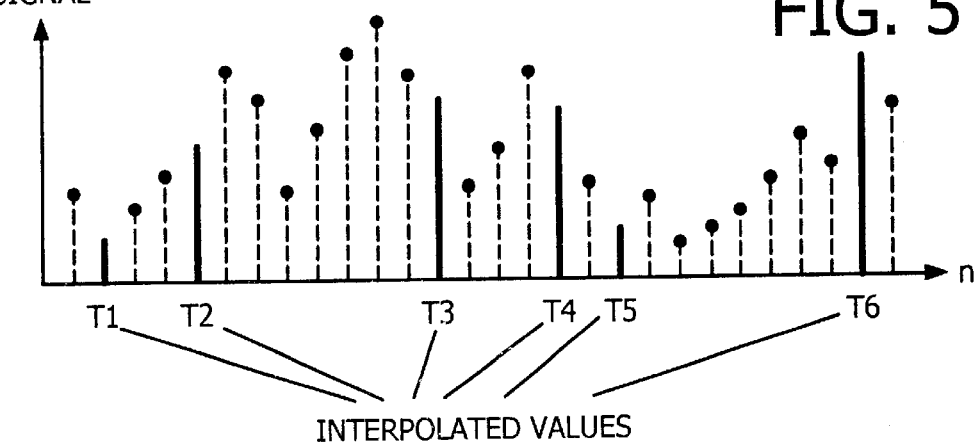
FIG. 5 is a timing diagram illustrating sampling with the A/D converter of FIG. 4.

FIG. 5 is a timing diagram illustrating sampling with the A/D converter of FIG. 4. It is evident from the figure that the interpolated values represented by the solid lines are not regularly spaced as in FIG. 2.

Figure 6:
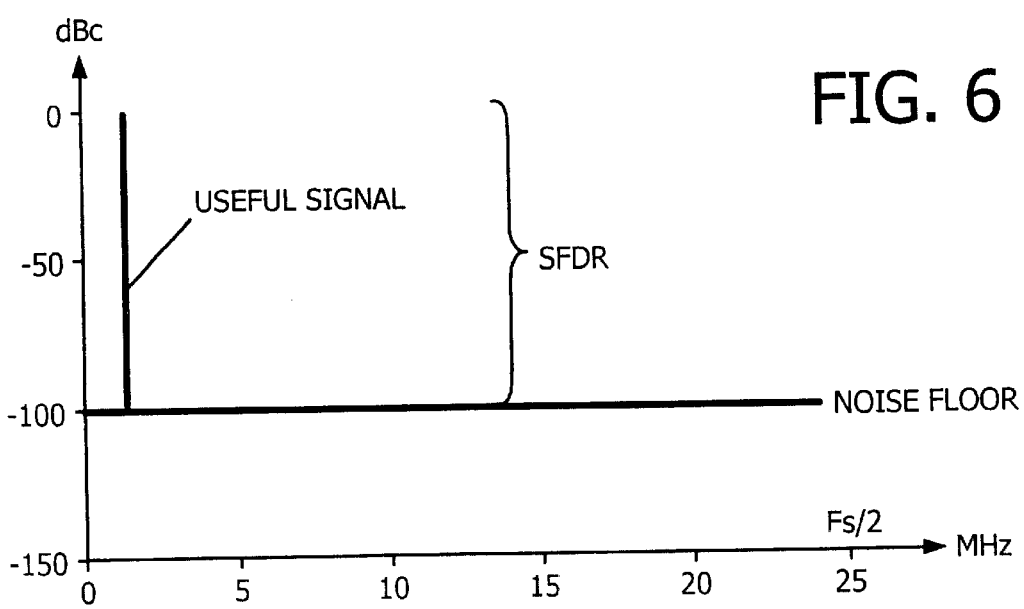
FIG. 6 is a simplified diagram illustrating the spectrum of a signal that has been digitized by the A/D converter in FIG. 4.

FIG. 6 is a diagram illustrating the spectrum of a signal that has been digitized by the A/D converter in FIG. 4. The spurious tones have been removed at the cost of a slightly raised noise floor. However, the spurious-free dynamic range (SFDR) has been increased by approximately 25 dB.

Figure 7:
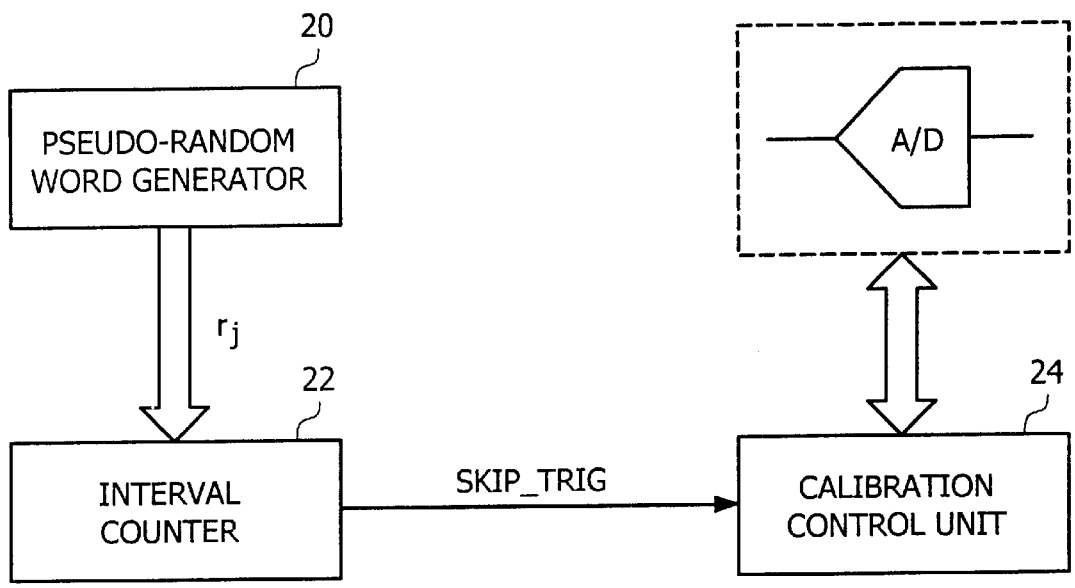
FIG. 7 is a block diagram illustrating an exemplary embodiment of an A/D converter in accordance with the present invention.

The random time interval generator 18 of FIG. 4, operates to control the timing of the background calibration of the A/D-converter 10. The random spacing between consecutive skip-and-fills can be generated several ways. For example, each calibration time $i_j$ can be written as:

$$i_j = r_j + i_{j-1}$$

where $r_j$ is a random integer value ranging from $r_{min}$ to $r_{max}$. An exemplary implementation of a random timing-generator is shown in FIG. 7. A (pseudo) random word generator 20 provides an integer value $r_j$ to an interval counter 22 used to trigger a calibration skip-and-fill. When the counter has counted up to (or down from) $r_j$, a trig-pulse SKIP_TRIG is sent to a calibration control unit 24 which initiates a single-step calibration cycle or a step of a multi-step calibration cycle.

Figure 8:
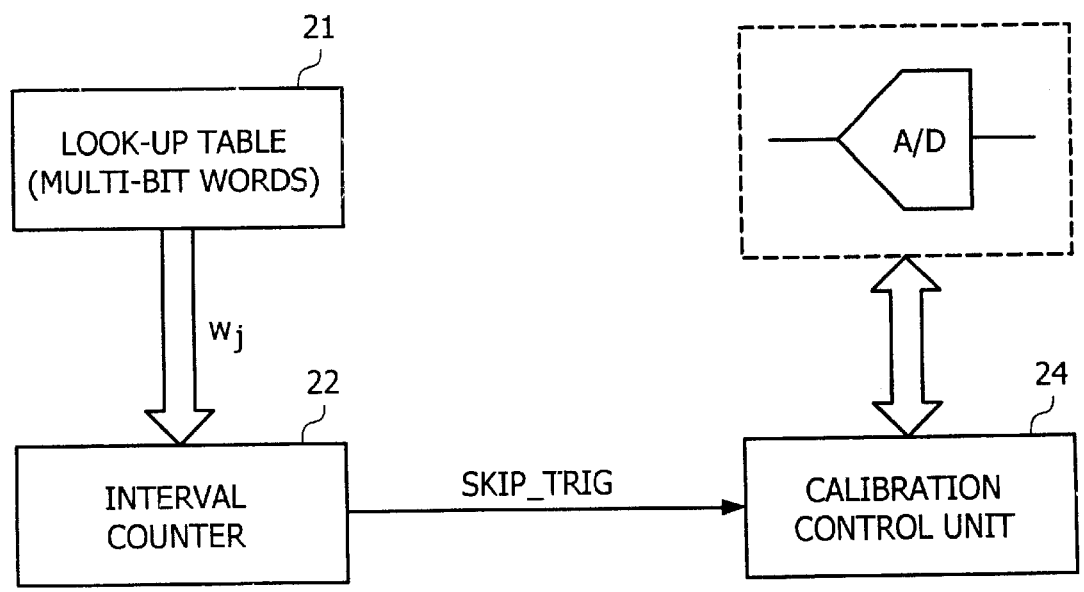
FIG. 8 is a block diagram illustrating another exemplary embodiment of an A/D converter in accordance with the present invention.

A look-up table 21 with a sequence of predefined skip-intervals may be used instead of a random word generator. The look-up table 21 provides a multi-bit word $w_j$ to the interval counter 22 to trigger the calibration skip-and-fill. This is illustrated in the embodiment of FIG. 8. The "randomness" of the fixed sequence of skip intervals can be examined beforehand, and a sequence with acceptable spectral properties is then chosen.

Figure 9:
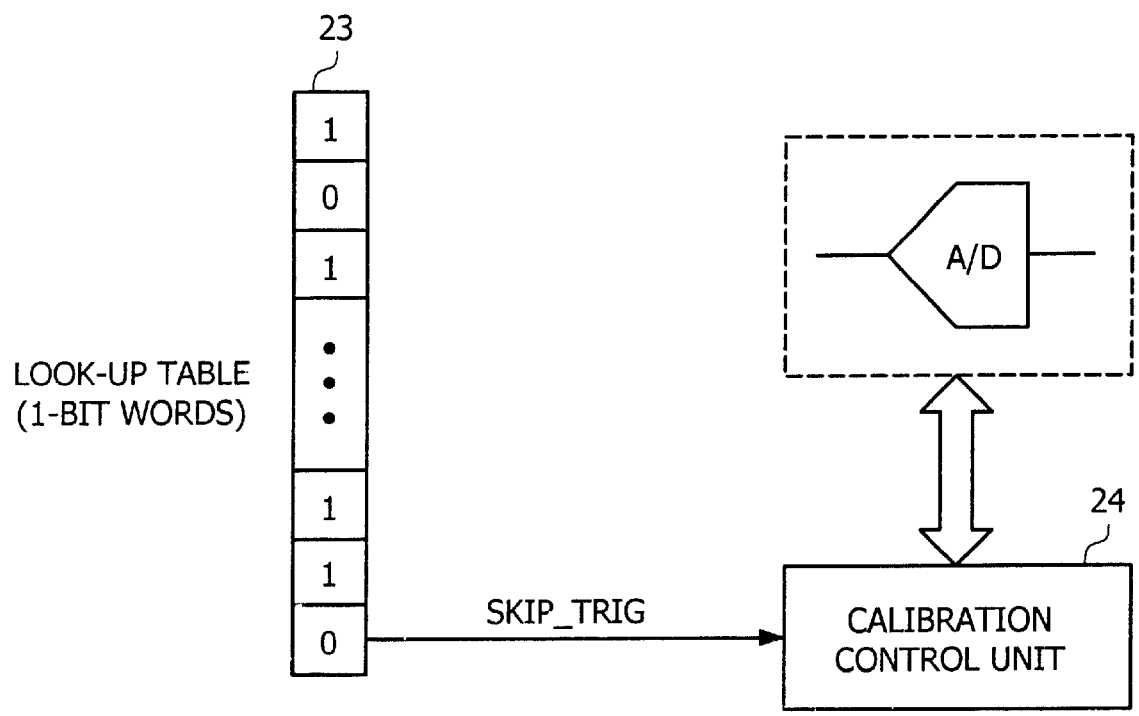
FIG. 9 is a block diagram illustrating yet another exemplary embodiment of an A/D converter in accordance with the present invention.

The interval counter 22 of FIG. 8 may be excluded if a fixed 1-bit sequence representing the SKIP_TRIG signal itself is stored in a long 1-bit/word memory, as shown in FIG. 9. Again, the randomness of the occurrences of SKIP_TRIG=1 is studied, and a suitable sequence of ones and zeros is chosen. This direct look-up table approach can be suitable for very dense background calibration schemes, although its drawback is that a very long memory is usually needed. If, for example a sequence cannot be repeated more often than every 8 k sample, an 8 kbit memory is required.

Figure 10:
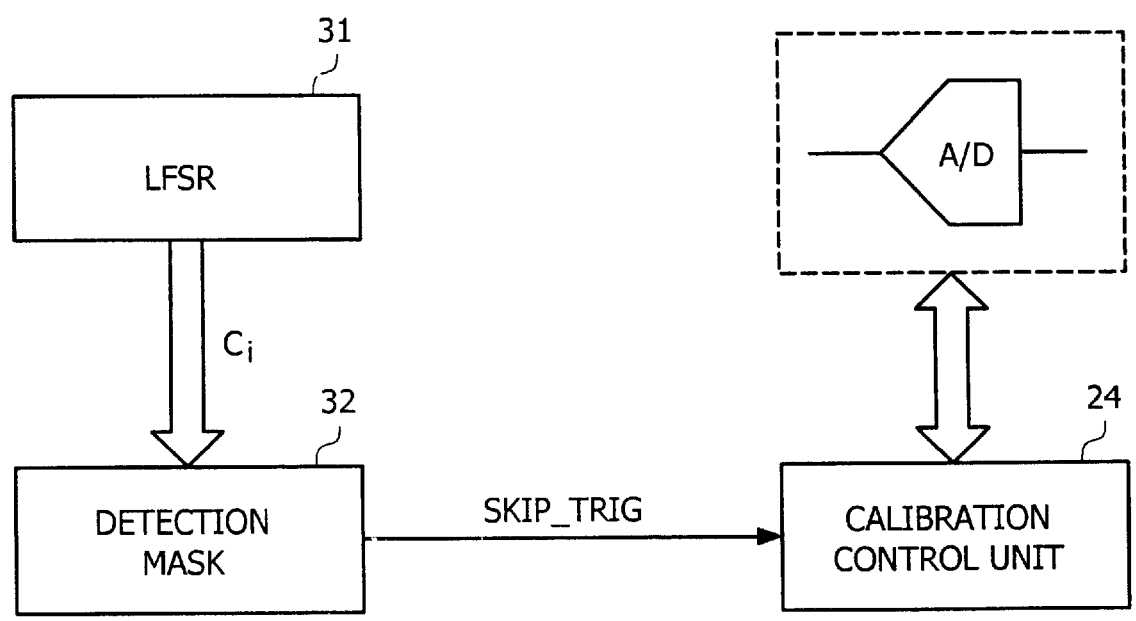
FIG. 10 is a block diagram illustrating yet another exemplary embodiment of an A/D converter in accordance with the present invention.

In another embodiment, a linear feedback shift register (LFSR) 31 is used to generate pseudo-random time intervals, as illustrated in FIG. 10. This use is different from known earlier uses of LFSRs, which are pseudo-random noise generators (1-bit sequences) and generation of several fixed-time periods. See U.S. Pat. No. 5,606,584. The use of LFSRs as pseudo-random noise generators with scrambling of data to increase randomness is exemplified in U.S. Pat. No. 5,793,318, and with noise generation for calibrating a magnetic read channel is exemplified in U.S. Pat. No. 5,786,951, which are incorporated by reference. LFSRs are also used in spread-spectrum (including CDMA) communications and ranging systems for generating spreading codes, i.e., "long" codes and codes with special autocorrelation properties, as well as in cryptography.

The main requirements for the skip intervals are that they appear to be random within a relatively short signal segment, i.e., up to several thousand samples. Preferably a minimum time interval can be set in which a skip is not generated. This feature allows generation of a sufficient number of samples after a skip to permit interpolation.

Figure 11:
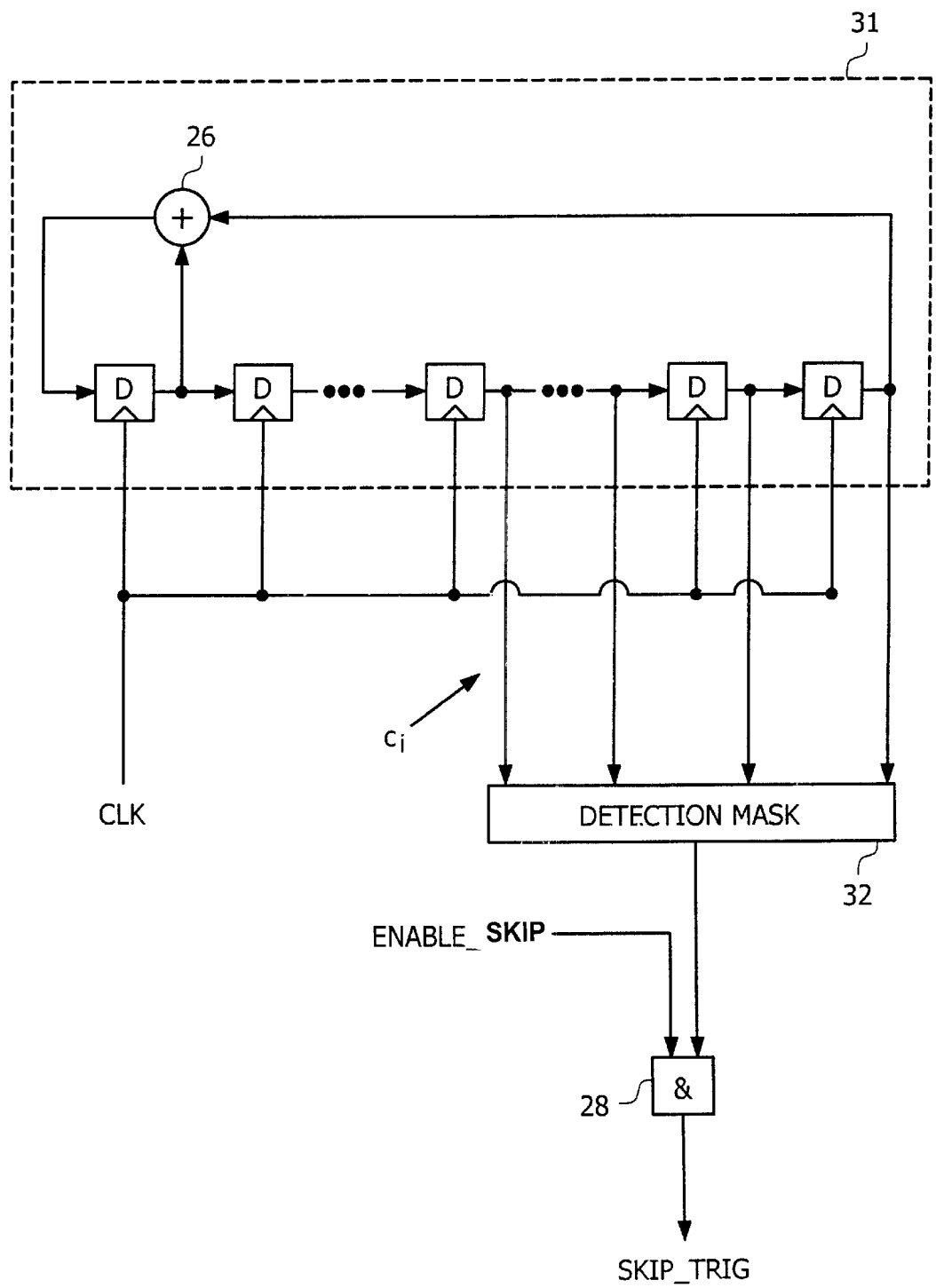
FIG. 11 is a block diagram illustrating an exemplary embodiment of a random time interval generator suitable for use in an A/D converter in accordance with the present invention.

The basic idea in using a LFSR 31 to generate pseudo-random intervals is illustrated in FIG. 11. The idea is to use a short (shorter than register 31) detection mask 32 on a part of register 31, and generate a skip signal when the contents in the part of the register matches the detection mask. In the present invention, the register consists of either a serial connection of one-bit storage elements, e.g., D-latches, or a fixed length memory. The contents of the storage elements are shifted from one element to the next each clock period (in a fixed length memory implementation the reference point is shifted instead of the data). A feedback is provided from the last storage element and at least one other storage element, the outputs of which are combined in an XOR or XNOR gate 26.

The output bit-sequences provided by this type of register, with n storage elements, can be up to $2^n-1$ bits long, if the proper feedback connections are used. If other connections are used, shorter sequence lengths can be obtained. The different sequence lengths possible with a specific connection pattern are related to each other in that the register contents (words) that the LFSR 31 walks through during different sequences are mutually exclusive. This means that the same word can not belong to two different sequences. In the case of maximum-length sequences, one sequence contains all words except all zeros or all ones, and the other contains only the all-zeros word (or all-ones). In non-maximum length LFSRs, several sequences of different or equal lengths can be produced, depending on the contents of the register at startup.

Smaller parts of the register return to the same code several times during one long cycle. Statistically, all shorter codes of a given number of bits m appear equally in an arbitrarily chosen subset of a maximum-length LFSR, except for the all-zeros code which appears one time less. Non-maximum but long sequences also have a good statistical distribution of shorter codes. This can be used favorably in some cases, since some register sizes require more than two feedback connections in order to produce maximum-length sequences. A non-maximum length LFSR can then instead be produced with only two feedback connections, for ease of implementation. This can produce a sequence that is long enough to give a good statistical distribution of intervals between the used detection codes.

The detection of the smaller parts is done by matching the contents of chosen elements of the register 31 with the detection code mask 32. The register positions which are used for matching can be continuous or split into several parts, and can also start at different positions.

In order to increase the length of the cycle before the sequence of skip intervals repeats, a new detection code can be used for each long cycle of the LFSR 31. This effectively increases the length of the pseudo-random sequence of skip intervals by $2^m$ times, where m is the number of bits in the detection mask. In order to increase the randomness it is possible to change one or several bits of the detection mask between each m-sequence under the influence of some external analog or digital process, for example analog noise on the chip. Other schemes can also be devised, by for example changing the register positions that are compared with the detection code.

The provision of a minimum interval between sample skips can be arranged in several ways. One way is to let the circuitry responsible for providing the skip sample also generate an inhibit signal to the random interval circuit, or let this circuitry just ignore new skip signals during the time it is working. The inhibit signal could, for example, disable the detection circuitry over an AND gate 28 by providing a SKIP_ENABLE signal, as shown in FIG. 11.

Figure 12:
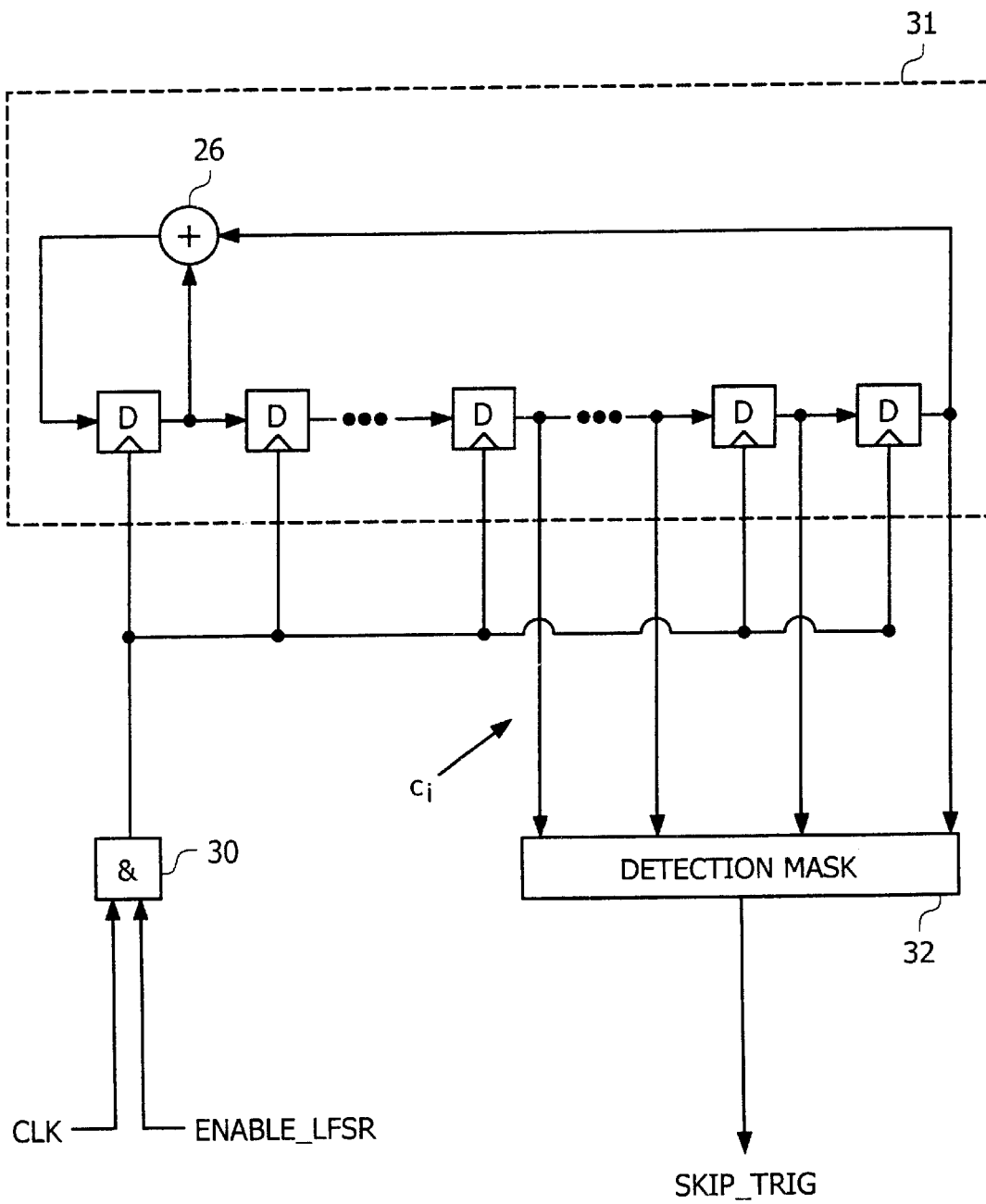
FIG. 12 is a block diagram illustrating another exemplary embodiment of a random time interval generator suitable for use in an A/D converter in accordance with the present invention.

Another embodiment for obtaining a minimum interval between sample skips is illustrated in FIG. 12. In this embodiment an ENABLE_LFSR signal is forwarded to an AND gate 30 and controls the clocking of the register 31.

Figure 13:
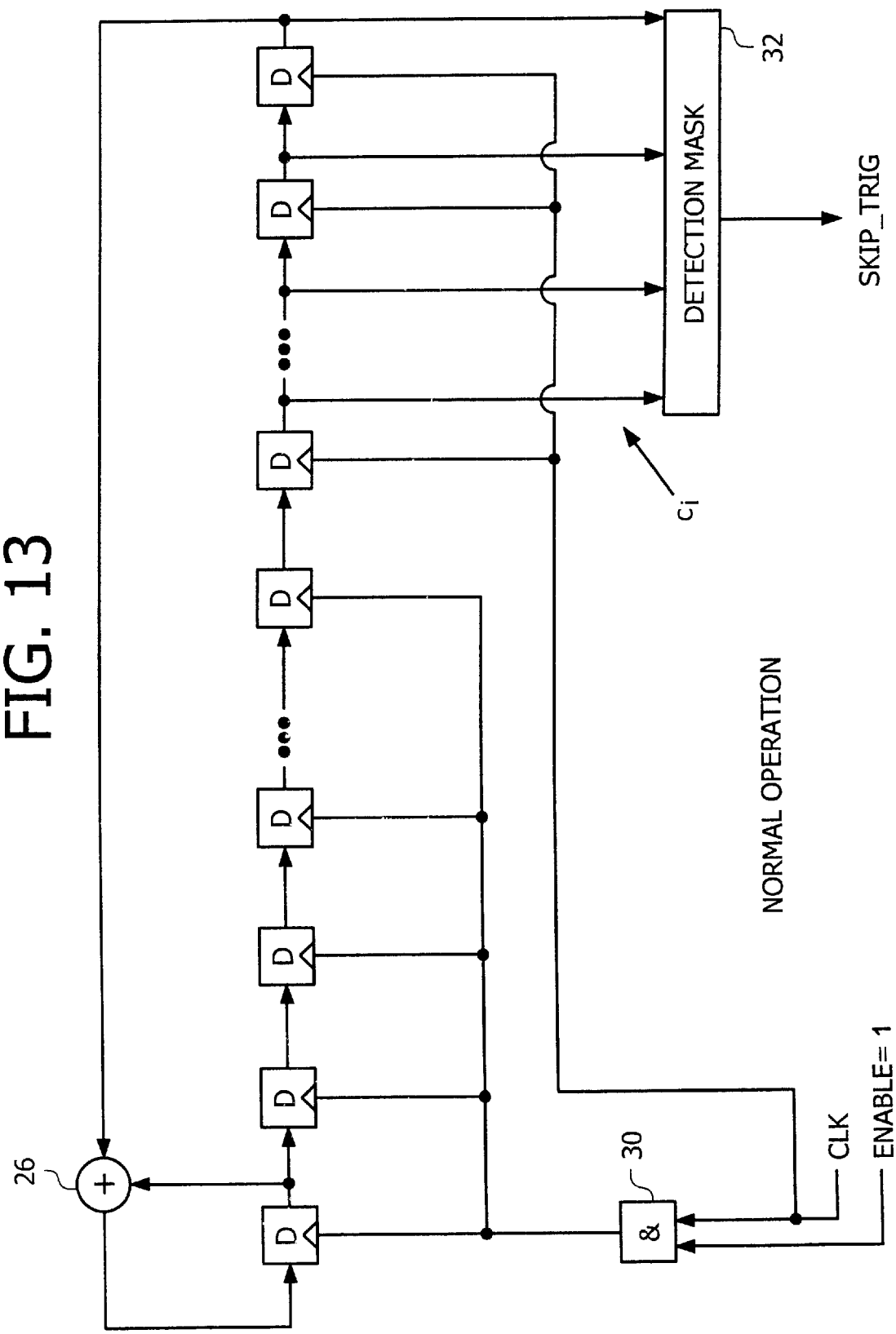
FIG. 13–14 are block diagrams illustrating yet another exemplary embodiment of a random time interval generator suitable for use in an A/D converter in accordance with the present invention.
Figure 14:
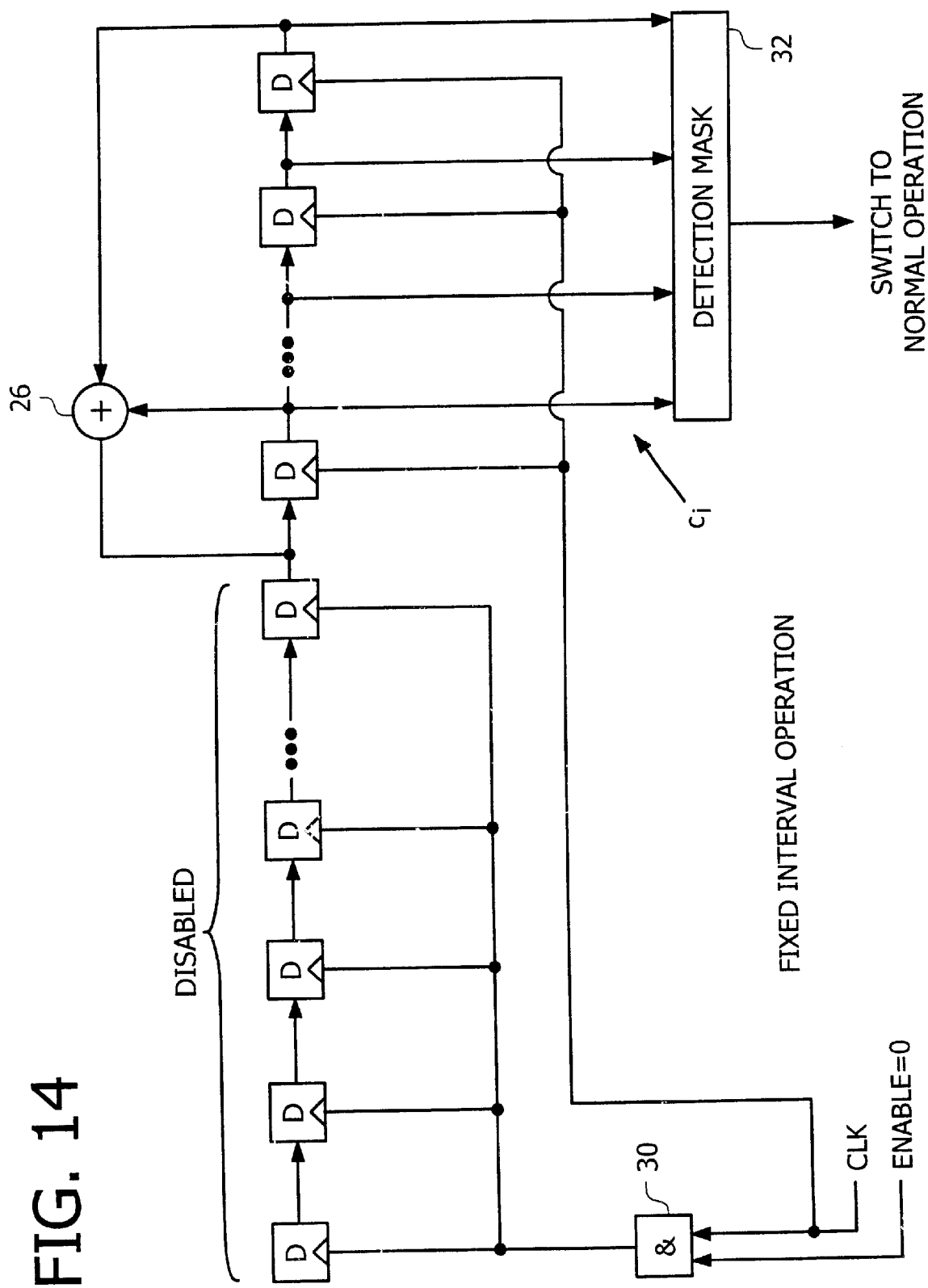

Another way to obtain a minimum interval is to have a counter start counting a predetermined interval starting at the generation of a skip signal, disabling the LFSR 31 or detection circuitry during this interval. This counter could also be made using a smaller LFSR generating a fixed interval. Such an embodiment is illustrated in FIGS. 13–14. A convenient way is to let a part of the LFSR 31 be reconfigured into a counter of a smaller LFSR (FIG. 14), for generation of the minimum interval. This embodiment could use the same detection code or part thereof as the regular detection code, the smaller LFSR counting back to the same code. The smaller register could be a maximum or non-maximum length LFSR for getting different minimum intervals. Different minimum intervals could also be obtained by initializing the small register or counter to different states.

The statistical distribution of skip intervals can be modified in several ways. By doing this, the skip intervals can be confined to be shorter than a predetermined length, and other statistics of the skip intervals can also be changed. The easiest way to modify the distribution of skip intervals is to simply use a different detection code or detection arrangement. Other varieties include detecting several codes, generating a skip signal at the first detected code. This procedure, which shortens the mean interval, can also be used in combination with detecting codes of different parts of the LFSR. Detecting multiple codes one after the other also changes the distribution of skip intervals, and can also be used to increase the mean interval. Changing the statistical distribution of skip intervals is a feature that may be used to dynamically change the average calibration rate. By sensing one or several external parameters, such as temperature, humidity, etc., it is possible to control and adapt the average calibration rate to changing operating conditions. For example, the average calibration rate may be temporarily increased during time periods of rapidly changing temperature.

The specific problem of having an upper limit for the skip intervals can be solved with the techniques previously discussed, but also by having a dedicated counter that generates a skip signal after a predetermined time period. When using only the detection code to ensure that the maximum interval is within bounds, the whole cycle distribution of m-bit detection codes can be studied beforehand, to determine which detection code has the best statistics. A way of reducing statistically the possibility of occasional very long skip intervals, without trying out the code in advance, is to detect multiple codes, where one code is longer than the other. This does not alter the statistical distribution much (the number of skips in a given time period stays about the same) but the possibility of a very long interval is reduced.

There are useful techniques to reduce the power consumption of the skip interval circuit and generate longer skip intervals. One technique is to clock the LFSR at a lower clock rate than the sample clock, possibly a submultiple $f_s/x$. This must be accompanied by a suitable change in the detection circuitry (shorter detection code length) to give the same average skip interval. The technique can also be used to generate longer skip intervals using the same LFSR and detection circuitry. Another power reduction technique already mentioned is to redirect the read and write addresses of a memory. Then the data need not be shifted between all latches at each clock cycle, which saves power especially for long shift register lengths.

In the description above it has been assumed that the skipped sample is obtained by interpolation. Another alternative is to provide a low performance auxiliary A/D converter that replaces the regular A/D converter during calibration. An important advantage of this embodiment is that the auxiliary A/D converter converts the actual signal, as opposed to calculating an interpolated value from neighboring samples.

Figure 15:
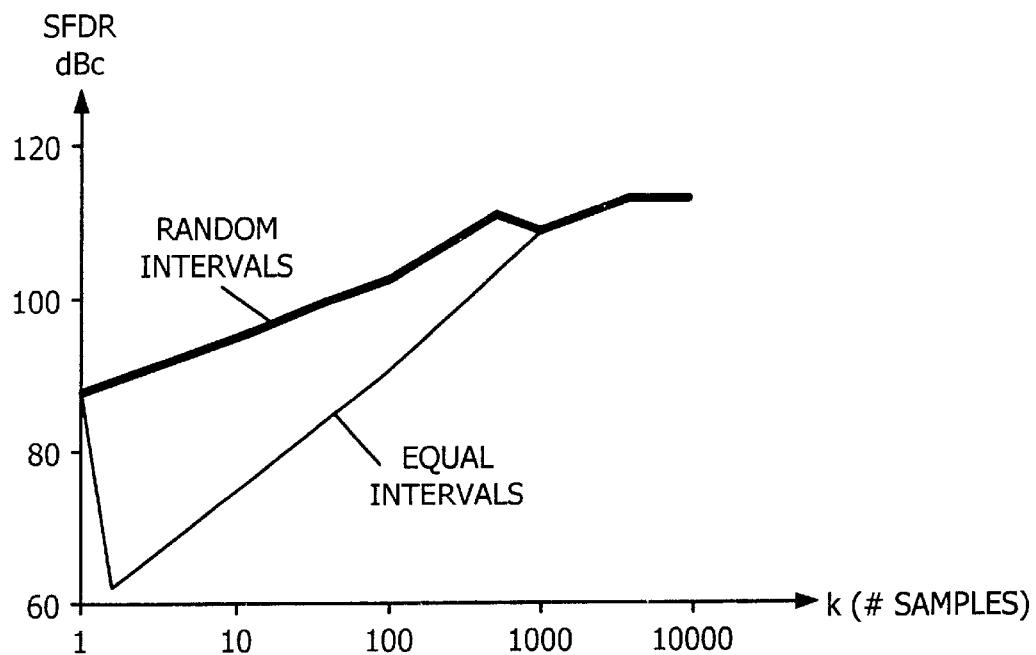
FIG. 15 is a diagram illustrating the improvement obtained by the present invention.

A few simulation results are included as an indication of possible performance. An auxiliary A/D converter in accordance with the previous paragraph was chosen for this example, using random and equidistant skip intervals respectively. An otherwise ideal 14-bit converter had every $k^{th}$ sample in a 16384 samples sequence replaced by a 10-b fill sample (from the auxiliary A/D converter) when equidistant skip-and-fill was used. When random intervals were used, the randomization was chosen so that in average every kth sample was replaced. FIG. 15 shows how the spectral performance depends on the (average) interval length k for equidistant and random skip intervals. The interval length is swept from 1 to 10.000 samples, where the former extreme is equivalent to a stand-alone 10-b converter. The simulations indicate that randomized spacing allows for a much shorter re-calibration cycle with maintained SFDR than if equidistant calibration cycles are used.

Figure 16:
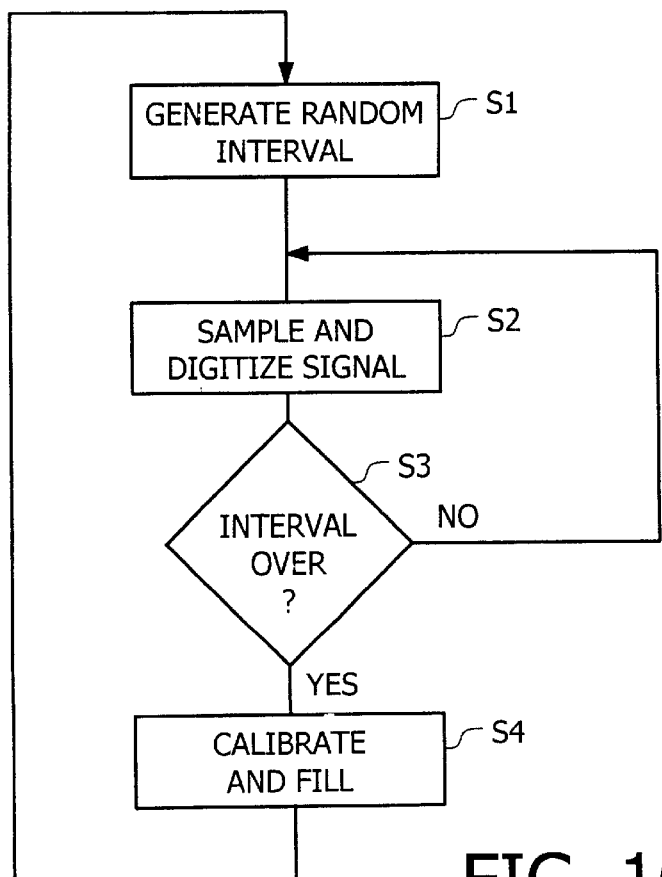
FIG. 16 is a flow chart illustrating an exemplary embodiment of the method in accordance with the present invention.

FIG. 16 is a flow chart illustrating an exemplary embodiment of the method in accordance with the present invention. Step S1 generates a random interval. Step S2 generates a digital sample of the input signal. Step S3 tests whether the generated interval has elapsed. If not, the steps S2 and S3 are repeated. If the interval has elapsed, step S4 initiates a calibration (either a complete cycle or a part thereof) and fills in the missed sample, for example by using an auxiliary A/D converter. Thereafter step S1 is repeated to generate a new random interval.

From the description above it is appreciated that an advantage of the present invention is that it allows for a more dense spacing of calibration (skip) cycles, which leads to a shorter re-calibration cycle. This, in turn, allows for better tracking of fast-changing operating conditions.

The invention represents a generic method, applicable to background calibration of most known wideband A/D converter architectures, and therefore covers a large number of applications, not only those related to digital radio systems.

The present invention is not limited to a particular calibration scheme. Instead, by using the present invention it becomes possible to improve the overall system performance while using one of a wide range of novel and existing background calibration schemes.

The present invention is not limited to the "auxiliary-ADC" approach used for illustration of the benefits of the invention. It is equally applicable to interpolation-type skip-and-fill background calibration, and in fact any background calibration that occasionally disturbs the data-flow through the main conversion path.

The LFSR-based embodiment of the present invention is particularly hardware- and power-efficient, since the timing is defined by directly observing internal states of the LFSR, rather than having an LFSR generating random target vales for the up/down counter. Also, the amount of hardware required for a given sequence length increase very slowly (logarithmically) with the length of the pseudo-random sequence. This is particularly interesting if the logic circuits are to be integrated on-chip, using an analog-oriented manufacturing technology. In such a technology digital circuits usually take more chip area and power than when implemented in a true digital manufacturing process.

The invention is applicable to A/D converters used in wideband digital radio systems, such as WCDMA, or multi-carrier/multi-standard systems. It can also lead to significant performance and/or reliability improvements and cost-reductions in the design of ADSL/VDSL systems.

It will be understood by those skilled in the art that various modifications and changes may be made to the present invention without departure from the scope thereof, which is defined by the appended claims.

What is claimed is:

1. A background calibrated analog-to-digital (A/D) converter, comprising:

a random time interval generator adapted to initiate background calibration at randomly selected time instants to increase the spurious-free dynamic range of the A/D converter.

2. The A/D converter of claim 1, wherein said random time interval generator comprises:

pseudo-random word generator that generates pseudo-random time intervals, and a time interval counter that initiates background calibration each time a pseudo-random time interval has elapsed.

3. The A/D converter of claim 1, wherein said random time interval generator comprises:

a multi-bit word look-up table that generates pseudo-random time intervals, and a time interval counter that initiates background calibration each time a pseudo-random time interval has elapsed.

4. The A/D converter of claim 1, wherein said random time interval generator comprises:

a 1-bit word look-up table that generates a pseudo-random bit sequence for initiating pseudo-random background calibration.

5. The A/D converter of claim 1, wherein said random time interval generator comprises:

a linear feedback shift register; and a detection mask that detects matches between a portion of said linear feedback shift register and a predetermined detection code, and generates a sample skip signal initiating background calibration each time a match is detected.

6. The A/D converter of claim 1, including means for restricting the minimum allowed time interval between two consecutive background calibrations to a predetermined value.

7. The A/D converter of claim 1, including means for dynamically changing the statistical distribution of the time intervals between background calibrations.

8. The A/D converter of claim 7, including means for sensing at least one parameter representing operating conditions and dynamically controlling the average time interval length with said sensed parameter.

9. The A/D converter of claim 1, including an auxiliary A/D converter for filling in samples during background calibration.

10. A method of background calibrating an A/D converter comprising the step of:

initiating background calibration at randomly selected time instants to increase the spurious-free dynamic range of the A/D converter.

11. The method of claim 10, wherein a minimum allowed time interval between two consecutive background calibrations is restricted to a predetermined value.

12. The method of claim 10, comprising the additional step of:

dynamically changing the statistical distribution of the time intervals between background calibrations.

13. The method of claim 12, comprising the additional step of:

sensing at least one parameter representing operating conditions and dynamically controlling the average time interval length with said sensed parameter.

* * * * *